United States Patent
Irissou (10) Patent No.: US 6,303,967 B1
(45) Date of Patent: Oct. 16, 2001

(54) PROCESS FOR PRODUCING AN ISOLATED PLANAR HIGH SPEED PIN PHOTODIODE

(75) Inventor: Pierre Irissou, Sunnyvale, CA (US)

(73) Assignee: Integration Associates, Inc., Mountain View, CA (US)

(*) Notice: Subject to any disclaimer, the term of this patent is extended or adjusted under 35 U.S.C. 154(b) by 0 days.

(21) Appl. No.: 09/425,131

(22) Filed: Oct. 22, 1999

Related U.S. Application Data (60) Continuation-in-part of application No. 09/246,264, filed on Feb. 8, 1999, which is a division of application No. 09/019,079, filed on Feb. 15, 1998, now Pat. No. 6,027,956.

(60) Provisional application No. 60/105,483, filed on Oct. 23, 1998.

(51) Int. Cl.[7] ................................................. H01L 21/76
(52) U.S. Cl. .............................. 257/406; 438/63; 438/64
(58) Field of Search ............................... 438/63, 64, 400, 438/74

(56) References Cited

U.S. PATENT DOCUMENTS

| | | | |
|---|---|---|---|
| H1137 | 2/1993 | Easter et al. ........................ | 437/62 |
| 3,898,686 | 8/1975 | Conradi .............................. | 357/30 |
| 4,625,225 | 11/1986 | Goodfellow et al. ............... | 357/30 |
| 4,835,595 | 5/1989 | Oho et al. ........................... | 357/30 |
| 4,847,210 | 7/1989 | Hwang et al. ...................... | 357/30 |
| 5,013,681 | 5/1991 | Godbey et al. ..................... | 437/86 |
| 5,101,253 | 3/1992 | Mizutani et al. ................... | 357/30 |
| 5,239,193 | 8/1993 | Benton et al. ...................... | 257/292 |
| 5,344,499 | 9/1994 | Kanbara et al. .................... | 136/258 |
| 5,360,987 | 11/1994 | Shibib ................................. | 257/446 |
| 5,587,611 | 12/1996 | Botka et al. ........................ | 257/458 |
| 5,598,022 | 1/1997 | Kyomasu ............................ | 257/458 |
| 5,773,352 | 6/1998 | Hamajima .......................... | 438/406 |
| 5,773,355 | 6/1998 | Inoue et al. ........................ | 438/459 |
| 5,801,084 | 9/1998 | Beasom et al. ..................... | 438/457 |
| 5,821,597 | 10/1998 | Nakajima et al. .................. | 257/458 |
| 5,963,785 | * 10/1999 | Katoh et al. ........................ | 438/33 |
| 6,027,956 | 2/2000 | Irissou ................................. | 438/68 |
| 6,075,275 | 6/2000 | Irissou ................................. | 257/458 |

OTHER PUBLICATIONS

Yamamoto et al., "Si–OEIC with a Built–in Pin–Photodiode", IEEE Transactions On Electron Devices, vol. 42, No.1, Jan. 1995, pp. 58–63.

Usami et al., "Evaluation of the Bonded Silicon on Insulator (SOI) Wafer and the Characteristics of PIN Photodiodes on the Bonded SOI Wafer", IEEE Transactions On Electron Devices, vol. 42, No. 2, Feb. 1995, pp. 239–243.

Kyomasu et al., "An Abnormal Phenomenon Due to Substrate Bias Modulation in the Integrated PIN Photodiode Sensor with Dielectric Isolation", IEEE, IMTC'94, May 10–12, pp. 238–241.

* cited by examiner

Primary Examiner—Olik Chaudhuri
Assistant Examiner—Douglas A. Wille
(74) Attorney, Agent, or Firm—McDonnell Boehnen Hulbert & Berghoff; Vernon W. Francissen (57) ABSTRACT

A method is shown for producing a PIN photodiode using a reduced number of masks wherein an intrinsic layer of the photodiode can be made arbitrarily thin. A fabrication substrate is lightly doped to have a first conductivity type in order to form the intrinsic layer of the photodiode. A first active region of the photodiode having the first conductivity type is formed on a first surface of the fabrication substrate. An oxide layer is also formed upon the first surface of the fabrication substrate. A handling substrate is bonded to the first surface of the fabrication substrate. A second surface of the fabrication is then lapped to a obtain a preselected thickness of the intrinsic layer. A second active region of the photodiode having a second conductivity type is formed on the second surface of the fabrication substrate. A groove is etched from the second surface of the fabrication substrate through the intrinsic region to the first surface in order to isolate the photodiode.

14 Claims, 13 Drawing Sheets

STARTING MATERIAL

BONDING

PROCESS FOR PRODUCING AN ISOLATED PLANAR HIGH SPEED PIN PHOTODIODE

This application is a continuation-in-part of U.S. application Ser. No. 09/246,264, filed Feb. 8, 1999, which was a divisional of U.S. application Ser. No. 09/019,079, filed Feb. 15, 1998, now U.S. Pat. No. 6,027,956. This application also claims the benefit of U.S. Provisional Application No. 60/105,483, filed Oct. 23, 1998.

BACKGROUND OF THE INVENTION

1. Field of the Invention

The present invention is directed toward an improved manufacturing process for a producing an isolated planar high speed PIN photodiode.

2. Description of the Related Art

Photodiodes are diodes in which charge carriers are generated responsive to light incident upon the photodiode. Any PN junction diode which admits light can function as a photodiode. A photodiode outputs voltage or current when absorbing light. In a photodiode which is intended for high speed communication systems, it is important to optimize the performance for light conversion efficiency, speed (minimal transit time delay), minimum RC time constant, ability to operate at low reverse bias voltage, and cost in the application in which the photodiode will be employed.

Figure 1:
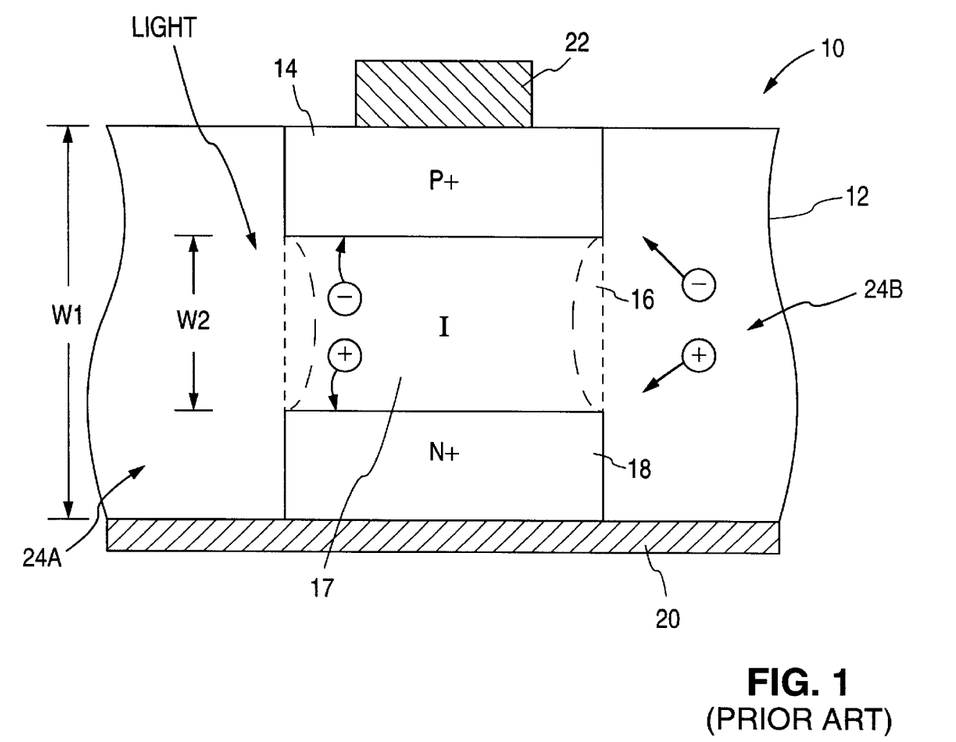
FIG. 1 describes the structure of a conventional PIN photodiode.

FIG. 1 illustrates the structure of a conventional PIN photodiode 10. A wafer 12 is lightly doped with N dopant in order to produce an intrinsic region 16. A P+ region 14 is formed on one surface of the wafer and an N+ region 18 is formed on the opposing surface of wafer 12 with intinsic region 16 interposed P+ region 14 and N+ region 18. A reflective layer 20 is disposed on the surface containing N+ region 18 with reflective layer 20 also acting as the electrical contact to N+ region 18. A metal contact ring 22 is disposed on the surface containing P+ region 14 to provide the electrical connection to the P+ region.

Typically, one power supply potential is applied to the reflective layer and another power supply voltage is applied to contact 22 to reverse bias the PN junction formed by P+ region 14 and N+ region 18. This forms a depletion region 17 within the intrinsic region 16 wherein electron and hole charge carrier pairs generated by light photons incident upon the intrinsic region 16 are rapidly accelerated toward the P+ and N+ regions respectively by the electric field of the reverse bias voltage. Charge carrier pairs are also typically generated outside the depletion region 17 in non-depletion regions 24A and 24B of intrinsic region 16 and diffuse, due to random thermal motion of the carriers, at a much slower velocity until they reach either depletion region 17 or the junction formed by P+ region 14 and intrinsic region 16 of photodiode 10.

A conventional photodiode that is designed for high quantum, i.e. light conversion, efficiency requires that the light path within the photo current collection zone, the non-depletion 24 and depletion 17 regions, be sufficient in length so that most of the light photons of the incident light signal are absorbed and converted into electron-hole pairs that are collectable at the $P_+$ and $N^+$ regions. Usually, this requires that the width W2 of the intrinsic region 16, which is the primary collection region between the $P^+$ 14 and $N^+$ 18 regions, be several times the length required for light absorption. If diode 10 has an efficient back-side reflector, such as reflective layer 20, which effectively doubles the light path within diode 10, then the intrinsic region 16 of the photodiode can be made narrower. For a typical near infrared silicon photodiode, the nominal absorption path length is about 15–25 microns. The path length should be at least two to three times the nominal absorption path length to obtain good light conversion efficiency.

On the other hand, a photodiode designed for high frequency response requires that the photo current pairs generated by the light signal be collected rapidly and that the diode RC time constant is fast Rapid photo current pair collection usually requires that most of the photo current pairs generated by the light signal be generated within the depletion region 17 which has a high drift velocity when reversed biased. Otherwise, the photo generated charge carrier pairs produced in the non-depletion regions 24A and 24B outside the depletion region 17, but within the diffusion distance of the collection electrodes 14 and 18, will have a diffusion velocity which is several hundred times slower than the velocity of the pairs generated within the depletion region 17. The photo generated charge carrier pairs in non-depletion regions 24A and 24B will slowly migrate for collection at P+ region 14 and N+ region 18 resulting in a tail on the trailing edge of the electrical signal corresponding to the light signal. The diffusion distance of the charge carriers is determined by the carrier mean free path before re-combination and may exceed 150 microns.

A fast RC time constant for photodiode 10 requires minimal capacitance and low series resistance between the electrical contacts 20 and 22 and the photo current pair collection sites at the margin between the depletion region 17 and P+ region 14 and the margin between depletion region 17 and N+ region 18. The greater the width W2 of the depletion layer 16, then the lower will be the capacitance per unit area of photodiode 10. Since the depletion width of the depletion region formed between P+ region 14 and N+ region 18 increases with the level of the reverse bias voltage, it is typical for high speed photodiodes to have a relatively high reverse voltage applied to them.

The inclusion of the separate lightly doped intrinsic region 16 between the $P^+$ and $N^+$ regions 14 and 18 results in a PIN diode with a wider depletion region 17, depending on reverse bias voltage, which improves the light collection efficiency, speed, and reduces capacitance over that of a simple PN photodiode structure. Tailoring the width of the intrinsic region 16 allows for enhanced performance and trade-offs for photodiode light conversion efficiency, response speed, and capacitance.

For example, a near infrared photodiode intended for use in a high speed, low cost IrDA data receiver operating from a 2.7V–5V power supply should ideally have an intrinsic layer width W2 of about 20–40 microns wide to allow for good light absorption efficiency and to allow for fill depletion of the intrinsic region 16 with a low 1–3V reverse bias, since typically not all of the power supply voltage is available for reverse bias. Such a diode will achieve minimal transit delay, less than 1 nanoseconds (ns), a minimal RC time constant, and optimal high current frequency response with low resistance in the intrinsic region 16.

Although a PIN photodiode outperforms a standard PN diode, it cannot be easily manufactured by standard semiconductor processes wherein fabrication is typically performed on only one side of the semiconductor wafer 12.

A PIN photodiode is typically produced by diffusing the $N^+$ diffusion region 18 on the back side of the lightly doped (N) wafer 12, diffusing the $P^+$ diffusion region 14 on the topside of wafer 12, and then adding metal contacts to each side of the wafer. Typically, the backside contact area connected to N+ region 18 is reflective layer 20 and is made of gold. The topside contact area 22 is an aluminum collector ring that is connected to P+ diffusion region 14. The intrinsic or depletion layer depth W2 is determined by the wafer starting thickness W1 less the thickness of the $N^+$ 18 and $P^+$ 14 diffusion regions. Since standard silicon wafers are 350–500 microns in thickness and N+ and P+ diffusions are only a few microns thick, this typically results in an intrinsic layer width W2 of 345–495 microns.

An improvement to the PIN manufacturing process described above is to lap the width W1 of the starting wafer 12 to as thin as 100 microns, which will reduce the intrinsic layer width W2 to about 95 microns. However, it is generally not practical to thin wafers beyond this limit without an excessive level of wafer breakage along with severe wafer handling and processing problems.

A PIN diode with an intrinsic region width W2 of 95 microns typically requires more than a 5V reverse bias to be applied to the P+ and N+ regions 14 and 18 in order to completely deplete the intrinsic region 16 and achieve optimal frequency response for the photodiode. Consequently, the use of such a PIN photodiode in a high speed data receiver operating from a standard power supply voltage level of 2.7V–5V results in degraded speed performance.

Another problem with the structure of PIN diode 10 is that the connection of reflective layer 20 on the backside of wafer 12 requires the conductive bonding of the die of photodiode to a conductive substrate which may not be at the desired power supply potential or may not be a convenient electrical connection in the receiver design. In addition, if this conductive substrate is the active output of a photodiode it may undesirably act as an antenna for noise pickup.

Another method which has been attempted to produce a low cost PIN diode is to grow an epitaxial intrinsic layer on top of an $N^+$ or $P^+$ diffusion. However, because such an epitaxial layer is grown at high temperature it has high auto-doping levels due to the diffusion of the dopants of the underlying diffusion region which consequently prevents the formation of a lightly doped intrinsic layer 16.

Another method for producing a PIN diode 10 that is more successful is to grow an insulating oxide layer on top of the $N^+$ or $P^+$ diffusion and then to grow a thick polysilicon layer of several hundred microns to act as a handling layer so that the wafer 12 may be lapped as thin as needed to obtain the desired intrinsic region width W2. Following the lapping operation, the PIN diode can be processed in the standard way. Although this method is proven effective, growing a thick polysilicon layer is an expensive processing step.

One problem with the structure of PIN photodiode 10 is that the junction between the P+ region 14 and intrinsic region 16 does not extend to the edge of the photodiode. This is done in order to prevent shorting of the junction to the intrinsic region when cutting wafer 12 to obtain the individual die for each photodiode. Consequently, the depletion region 17 produced by the reverse bias voltage does not fully extend to the edge of the die resulting in non-depletion regions 24A and 24B at the edge of photodiode 10 which can be significant sources of slow diffusing photo generated carriers. A metal light guard ring is typically placed over the edge region of photodiode 10 to minimize generation of carriers in drift regions 24A and 24B, but this does not fully suppress the formation of slow carriers.

Accordingly, it is an object of the present invention to reliably produce a PIN photodiode having high speed operation at low operating voltages.

SUMMARY OF PRESENT INVENTION

The present invention describes several improved methods utilizing standard IC processing technology, V-groove or trench etching technology, lapping technology, combined with the novel use of a handling wafer to produce a PIN diode featuring 1) an arbitrarily thin intrinsic region which can be depleted at a low operating voltage, 2) complete dielectric isolation of the backside of the photodiode from the mounting substrate, and 3) full dielectric isolation of the side walls which ensures the complete depletion of the active region and totally preventing the generation of slowly diffusing carriers.

An embodiment of a method, according to the present invention, for fabricating a PIN photodiode calls for providing a first semiconductor substrate lightly doped with a first dopant type, where the first semiconductor substrate has first and second planar surfaces. A first active region is formed by diffusing the first planar surface of the first semiconductor substrate with the first dopant type. A first oxide layer is formed on the first planar surface of the first semiconductor substrate. The method also sets forth bonding a first surface of a second semiconductor substrate to the first planar surface of the first semiconductor substrate. The second planar surface of the first semiconductor substrate is then lapped. A second active region is formed by selectively masking and diffusing a predetermined portion of the second planar surface of the first semiconductor substrate with a second dopant type. A second oxide layer is formed on the second planar surface of the first semiconductor substrate that is then selectively masked and etched to form a first contact hole and an etching opening. The etching opening in the second oxide layer is then selectively etched down to the first oxide layer to form an isolation trench. A first contact is formed within the first contact hole. In one embodiment of a process according to the present invention, a second contact is formed along the isolation trench adjacent to the first active region.

In another embodiment of a process according to the present invention, sidewalls of the isolation trench are diffused with the first dopant type to form an extension of the first active region that extends to the second planar surface of the first semiconductor substrate. A second contact hole is formed in the second oxide layer adjacent to the extension of the first active region and a second contact is formed within the second contact hole.

In yet another embodiment of a process according to the present invention, a glass layer is formed on the first surface of the second semiconductor substrate.

DETAILED DESCRIPTION OF THE PRESENT INVENTION

FIGS. 2A–L describe an improved PIN photodiode fabrication method which utilizes a standard thickness handling wafer with an isolating oxide layer grown on its surface that is bonded to the N+ diffusion side of a fabrication wafer. The handling wafer allows the intrinsic region of the fabrication wafer to be lapped to a thin thickness, as required for optimum performance of the PIN photodiode, while the handling wafer provides mechanical rigidity needed for processing. N+ and P+ regions are then diffused into the fabrication wafer. Next, diode trenches are etched around the periphery of each photodiode down to the N+ region. The sidewalls of the trenches are then N+ diffused before being covered with an oxide layer and then filled with polysilicon. Finally; coplanar metal contacts to the N+ and P+ regions are formed.

Figure 2A:
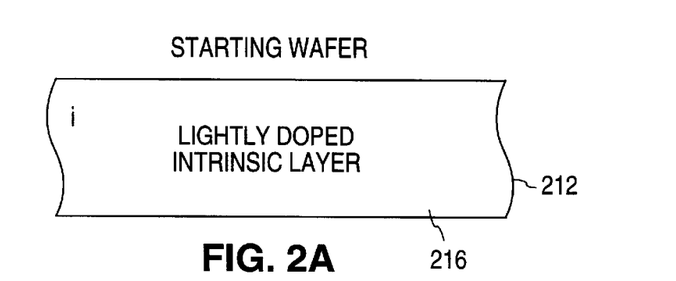
FIGS. 2A–L illustrate a series of steps for an embodiment of a process for producing a PIN photodiode according to the present invention.
Figure 2B:
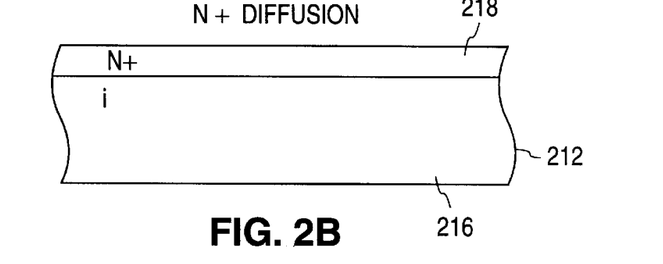

The process begins with fabrication wafer 212 of FIG. 2A, which is lightly N doped to form an intrinsic layer 216 which will later become the intrinsic region of a PIN diode. An N+ diffusion layer 218 is then formed on fabrication wafer 212, as shown in FIG. 2B.

Figure 2C:
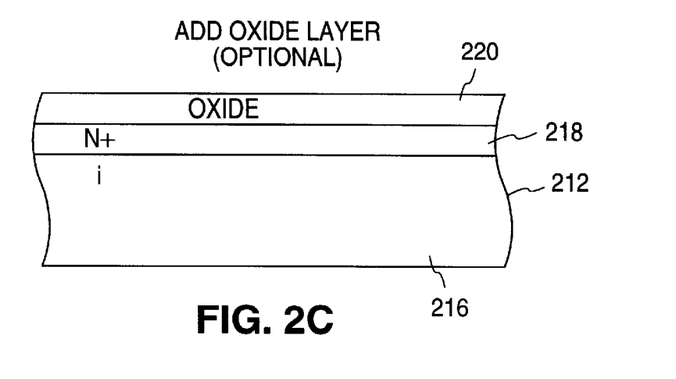

Optionally, an oxide layer 220 can be formed on the N+ layer 218 on fabrication wafer 212 in order to form a dielectric interference reflector which improves the light absorption efficiency of the PIN photodiode, as shown in FIG. 2C. Alternatively, the dielectric interference reflector can be formed by producing an oxide layer on the handling wafer 230.

Figure 2D:
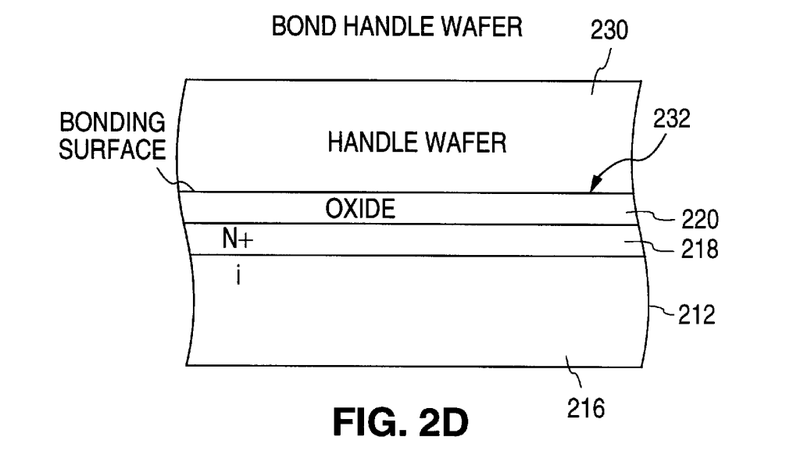

A handling wafer 230 is then bonded to a surface 232 of fabrication wafer 212 that includes the N+ diffusion 218, as shown in FIG. 2D. Bonding is accomplished by polishing the opposing faces of the handling wafer 230 and fabrication wafer 212 to a fine level of planarity. When the resulting highly planar surfaces of the handling wafer 230 and fabrication wafer 212 are subsequently pressed together, the polished surfaces will bind, to some degree, to one another through Van der Waal's cohesive forces. The handling wafer 230 and fabrication wafer 212 will become further bonded during the heating steps associated with subsequent processing steps, such as during the diffusion of dopants. The oxide layer 220 becomes important during these subsequent heating cycles as a barrier between the N+ diffusion 218 and the contaminants present in handling wafer 230. Also, it is important that the handling wafer 230 and fabrication wafer 212 have the same coefficient of thermal expansion to prevent warping or separation of the two wafers during the subsequent heating cycles.

Figure 2E:
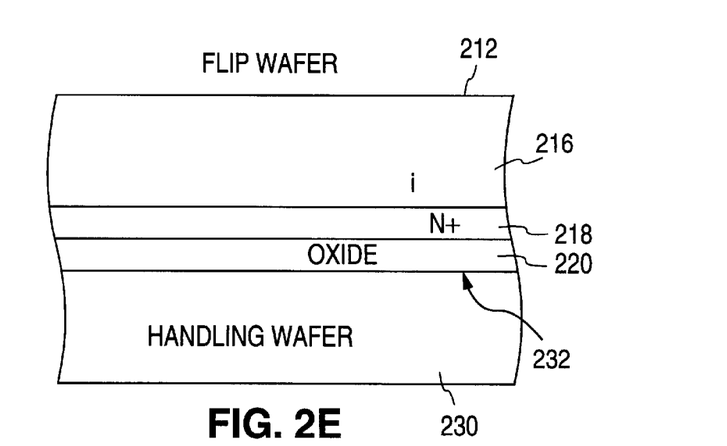
Figure 2F:
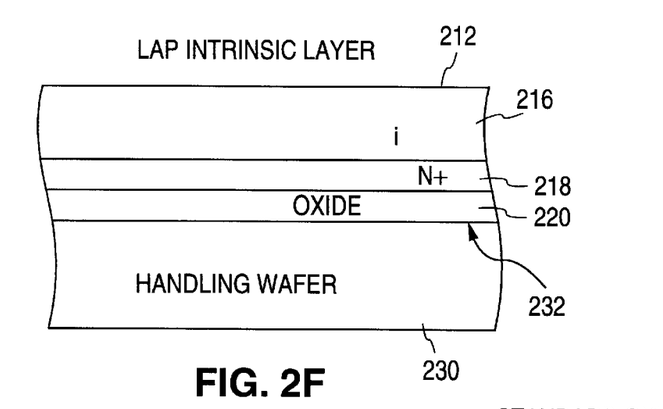
Figure 2G:
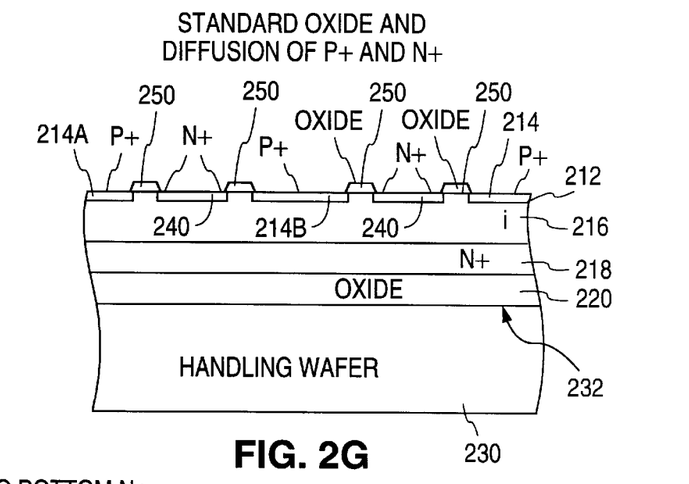

The structure formed by the fabrication wafer 212 bonded to the handling wafer 230 is then flipped, as shown in FIG. 2E, so that further fabrication processing can be performed on fabrication wafer 212. The intrinsic layer 216 can then be lapped to the desired thickness for optimal performance of the PIN diode by lapping fabrication wafer 212. In the process of the present invention, the thickness of intrinsic layer 216 is not constrained by requirements for mechanical integrity of the fabrication wafer 212 needed for subsequent processing steps, as is the conventional PIN photodiode and process. The handling wafer 230 provides the mechanical integrity needed for the handling required for further processing of the fabrication wafer 212 while the intrinsic layer 216 can be lapped to the optimal thickness for the operation of the PIN photodiode.

After the intrinsic layer 216 is lapped, P+ regions 214 are diffused into fabrication wafer 212 along with N+ regions 240. Oxide regions 250 are fabricated between P+ regions 214 and N+ regions 240 with the resulting structure shown in FIG. 2G.

Figure 2H:
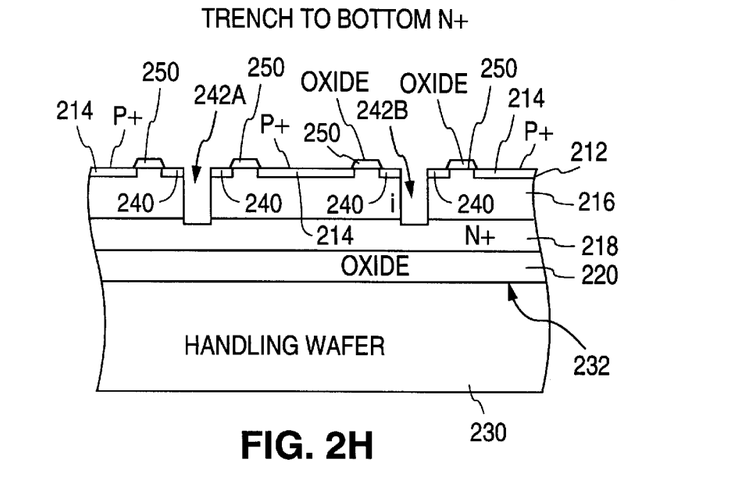
Figure 2I:
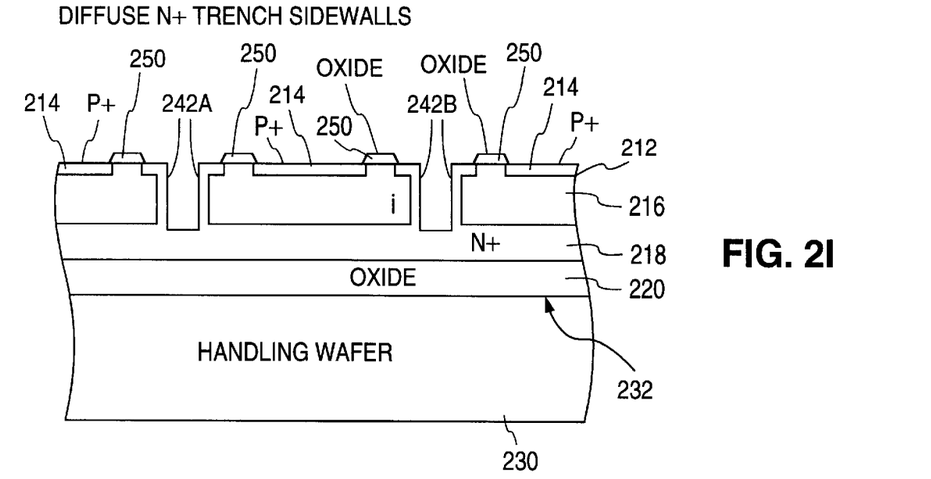
Figure 2J:
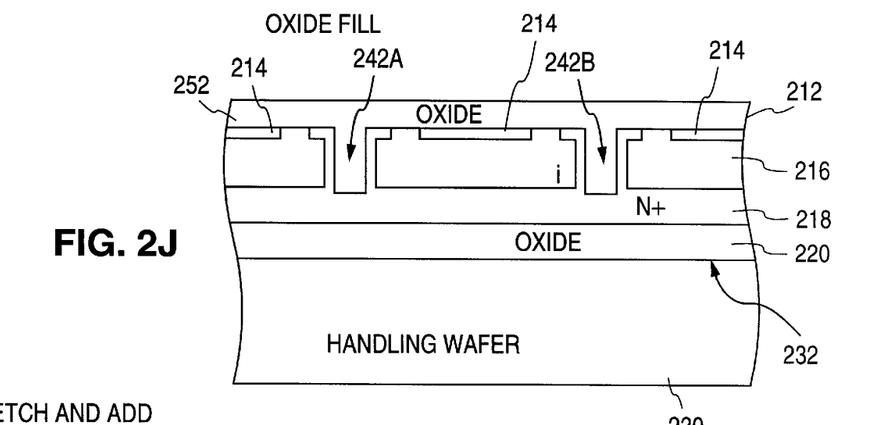

Isolation trenches 242A and 242B are then formed in N+ regions 240 and intrinsic layer 216 down to N+ layer 218, as shown in FIG. 2H. The sidewalls of trenches 242A and 242B are then N+ diffused to form a contiguous N+ region from layer 218 through trenches 242A and 242B to the surface of fabrication wafer 212, as shown in FIG. 2I. An oxide fill is then performed on fabrication wafer 212 that forms an oxide layer 252 that fills trenches 242A and 242B and covers the P+ regions 214 with the resulting structure shown in FIG. 2J.

Figure 2K:
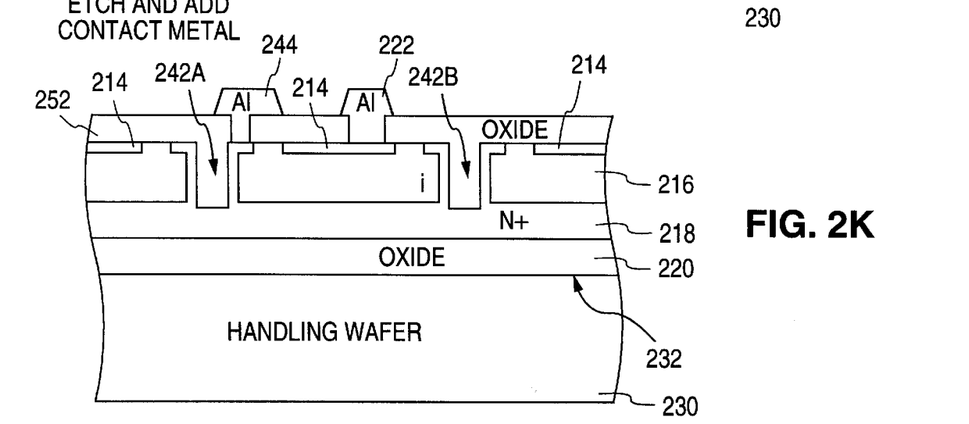

As shown in FIG. 2K, oxide layer 252 is then etched in the area of the N+ wall of trench 242A and the P+ region 214. Contact metal is added to these etched areas to form the cathode contact 244 to N+ layer 216 via trench 242A and the anode contact 222 to P+ region 216. The semiconductor die are then cut from fabrication wafer 212 and handling wafer 230 to form the individual PIN photodiode 270 shown in FIG. 2L.

Figure 2L:
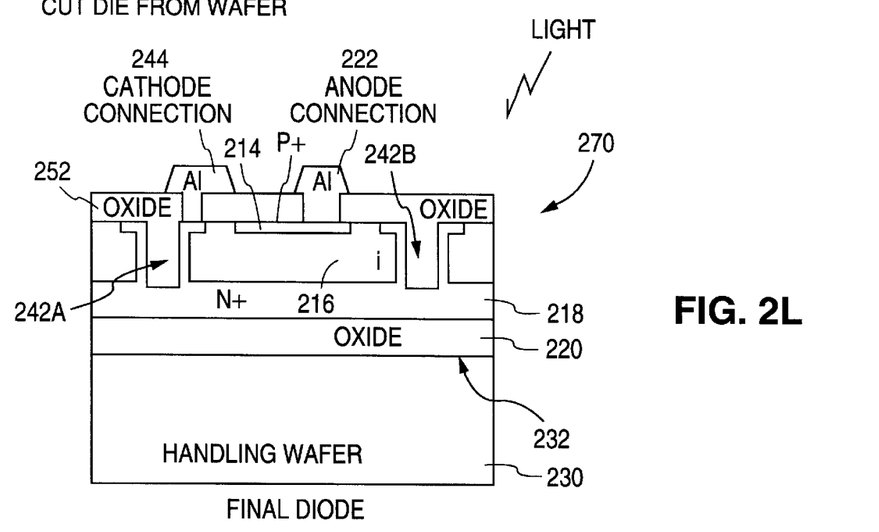

The resulting PIN photodiode 270 has a thinner intrinsic region 216 than can be obtained with conventional processes so that the thinner depletion region formed in the diode by lower reverse bias voltage levels will still permit high speed operation. In addition, isolation trenches 242A and 242B isolate the P+ region 214 and N+ region 218 of photodiode 270 from photo generated charge carrier pairs formed outside of intrinsic region 216, which again allows for higher speed operation of the photodiode.

Furthermore, photodiode 270 can be formed using standard semiconductor fabrication processes, rather than photodiode specific processes. And cathode contact 244 and anode connection 222 are coplanar, which allows for standard same-side bonding methods to be used to connect the photodiode to a receiver circuit and allows for additional flexibility in the polarity of the power connections to the photodiode.

FIGS. 3A–L illustrate another process for forming a PIN photodiode according to the present invention. In the process of FIGS. 3A–L, V-grooves are etched in a lightly doped fabrication wafer and then an N+ diffusion is performed around the periphery of what will ultimately become the photodiode. The N+ diffusion is overlaid with an oxide layer and the V-grooves are filled with polysilicon. The fabrication wafer is then polished and bonded to a handling wafer that provides mechanical strength. The intrinsic layer formed in the fabrication wafer can then be lapped to the thickness desired for optimal performance of the photodiode while the handling wafer provides the mechanical support for further processing of the fabrication wafer into a finished photodiode.

Figure 3A:
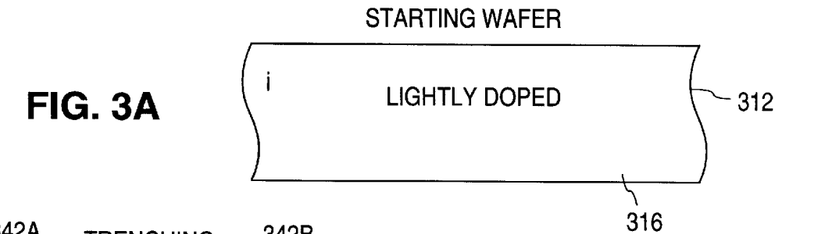
FIGS. 3A–L illustrate a series of steps for another embodiment of a process for producing a PIN photodiode according to the present invention.
Figure 3B:
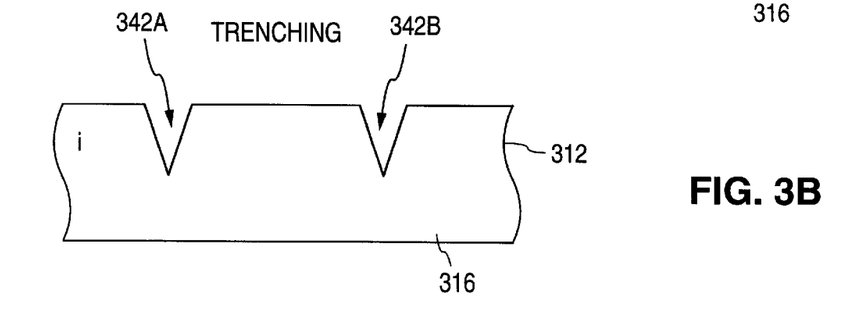
Figure 3C:
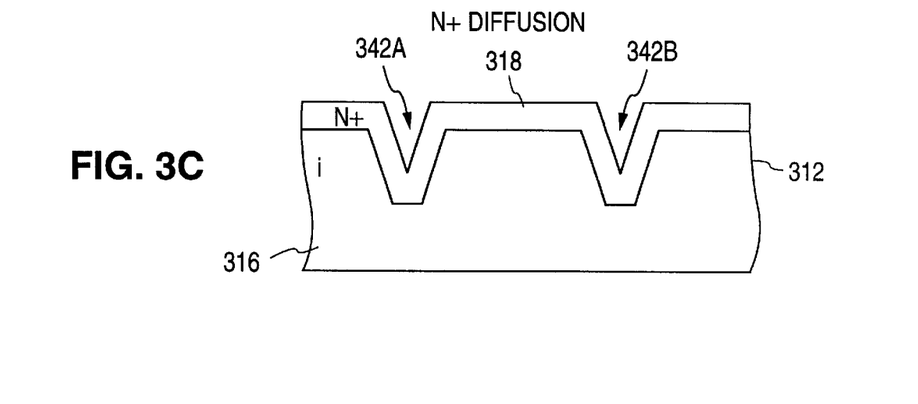
Figure 3D:
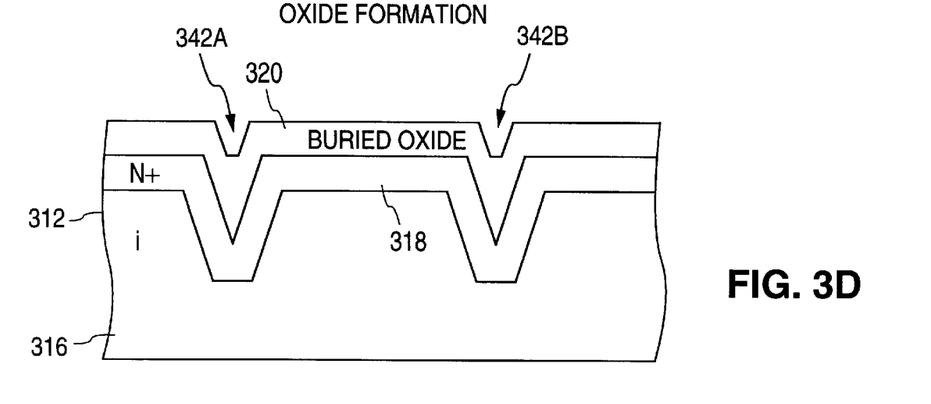

FIG. 3A shows a fabrication wafer 312 that is lightly N doped to form intrinsic layer 316. Fabrication wafer 312 is then etched to form V-grooves 342A and 342B, as shown in FIG. 3B. An N+ region 318 is then diffused into the etched surface of fabrication wafer 312 including the sidewalls of V-grooves 342A and 342B, as shown in FIG. 3C. A field oxide layer 320 is then formed upon fabrication wafer 312 which covers the N+ region 318 and fills V-grooves 342A and 342b with the resulting structure shown in FIG. 3D. Optionally, the thickness of field oxide layer 320 can be controlled so as to form a dielectric interference reflector for improved light absorption efficiency of the resulting photodiode.

Figure 3E:
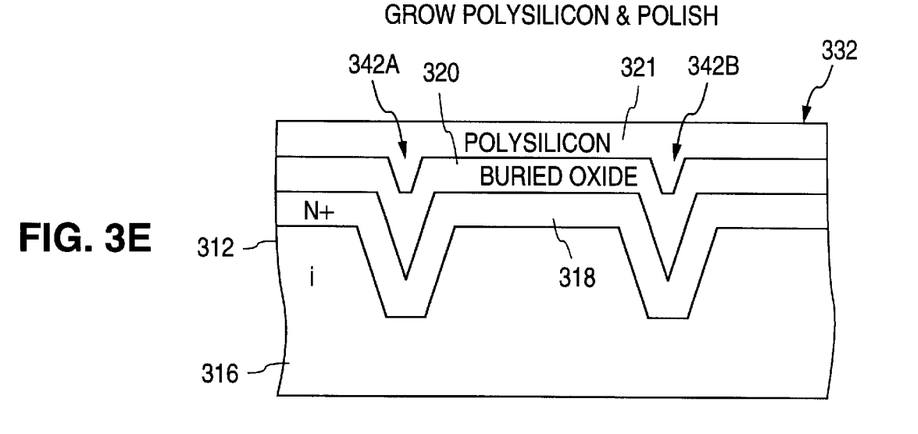

A polysilicon layer 321 is formed upon the field oxide layer 320. A surface 332 of the polysilicon layer is polished and fabrication wafer 312 is flipped, as shown in FIG. 3E. A handling wafer 330 is then bonded to the fabrication wafer at surface 332 to obtain the structure shown in FIG. 3F.

Figure 3F:
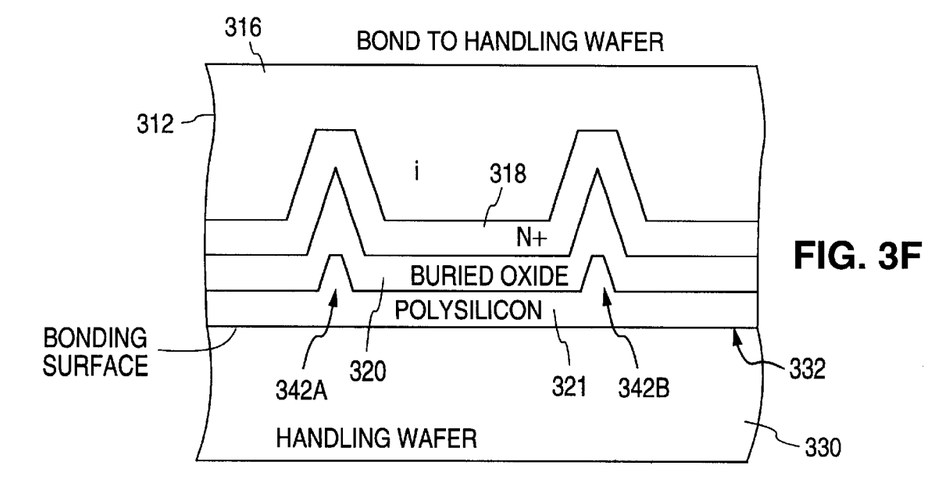
Figure 3G:
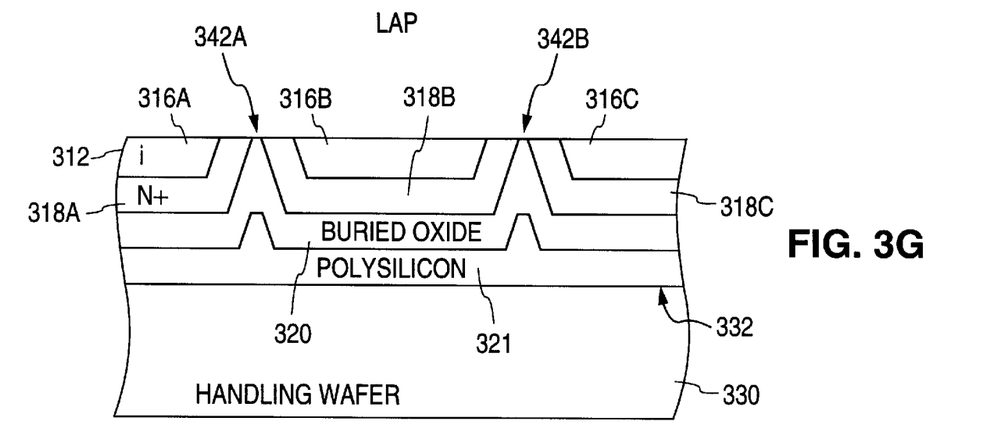

The polysilicon layer 321 has a thermal coefficient which is the same or approximately the same as the thermal coefficient of the silicon of fabrication wafer 312 and handling wafer 330. The thermal coefficient of the buried field oxide layer 320 is significantly different from the thermal coefficient of silicon. The oxide layer 320 is therefore kept thin, approximately 2 microns or less, and the polysilicon layer 321 is formed to prevent cracking of the fabrication wafer 312 as the fabrication wafer and handling wafer 330 are subjected to heating and cooling cycles during farther processing.

The intrinsic region 316 of fabrication wafer 312 can now be lapped to the desired thickness, in order to obtain the desired characteristics from the photodiode that is ultimately produced by this process, because handling wafer 330 provides the mechanical support required for the further handling needed to complete the fabrication process on the photodiode of fabrication wafer 312. Lapping fabrication wafer 312 results in the structure shown in FIG. 3G. Note that V-grooves 342A and 342B are of sufficient depth that, after lapping, the grooves reach the lapped surface and field oxide layer 320 isolates the N+ region 318 of each diode from the N+ region of other diodes. Thus, separate intrinsic regions 316A–C and N+ regions 318A–C are formed for each photodiode produced by the process and each photodiode is dielectrically isolated.

Figure 3H:
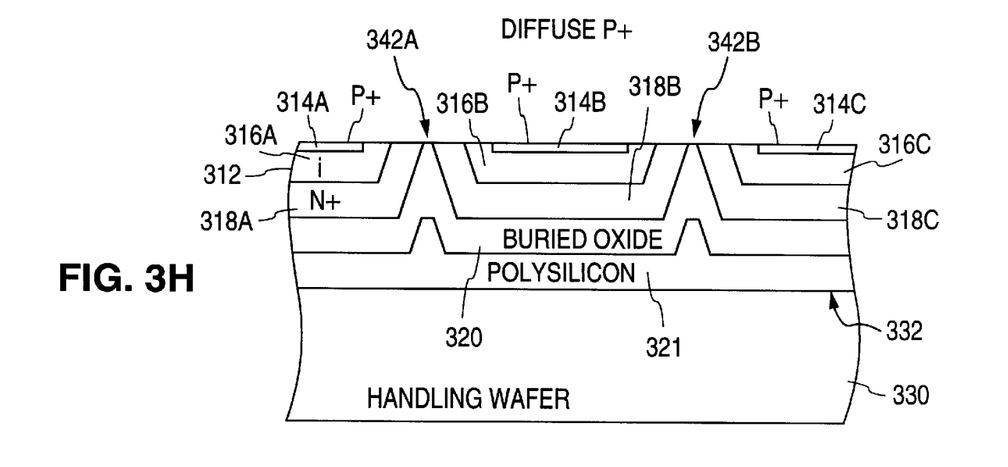
Figure 3I:
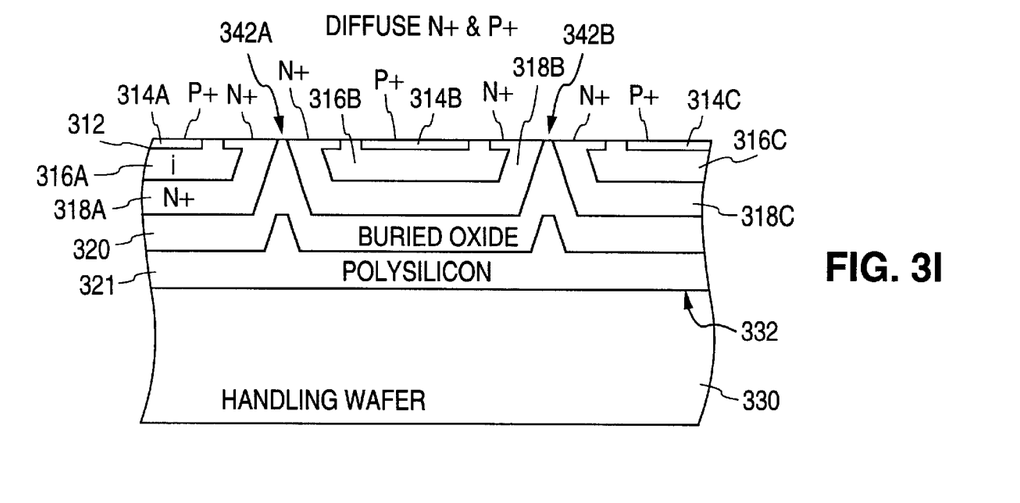
Figure 3J:
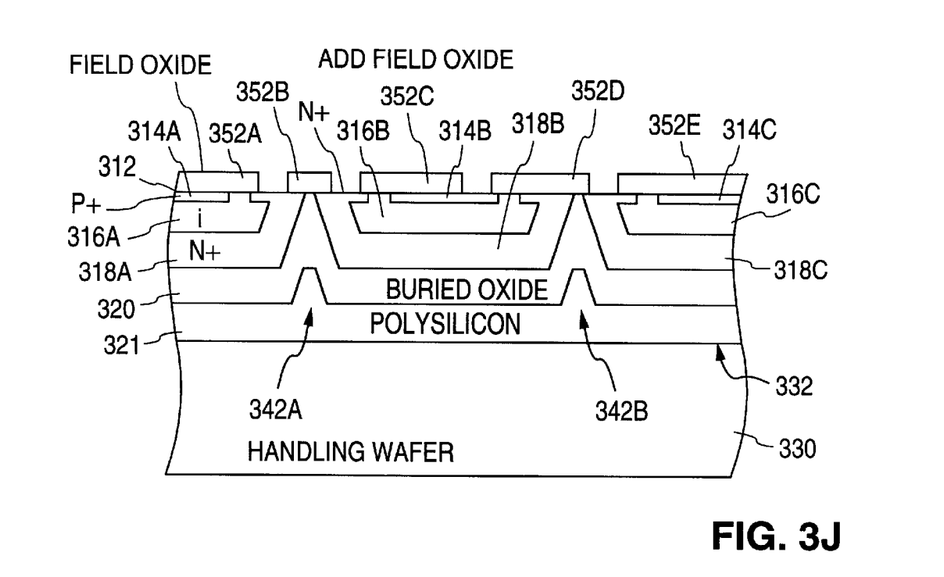
Figure 3K:
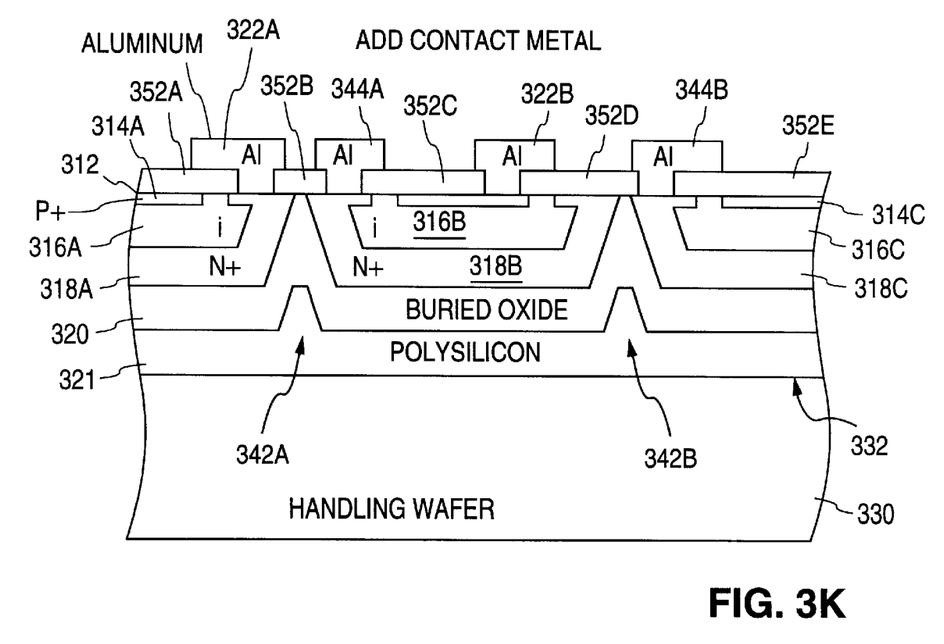

P+ regions 314A, 314B and 314C are then diffused into fabrication wafer 312 to form the PIN structure of the photodiodes, as shown in FIG. 3H. The N+ regions 318A–C are then further extended on the surface of fabrication wafer 312 by N+ diffusing additional surface contact area, as shown in FIG. 3I. Regions of field oxide 352A–E are then formed on the surface of fabrication wafer 312 where the regions of field oxide 352A–E leave contact openings to P+ regions 314A–C and N+ regions 318A–C, as shown in FIG. 3J. Contact metal is then added in the contact openings formed by the regions of field oxide 352A–E to form contacts 322A and 322B to P+ regions 314A and 314B, respectively, as well as contacts 344A and 344B to N+ regions 318B and 318C, respectively, as shown in FIG. 3K. Contacts will be formed to all the photodiodes formed on fabrication wafer 312, even though only a subset of the total number of photodiodes is illustrated in the drawings.

Figure 3L:
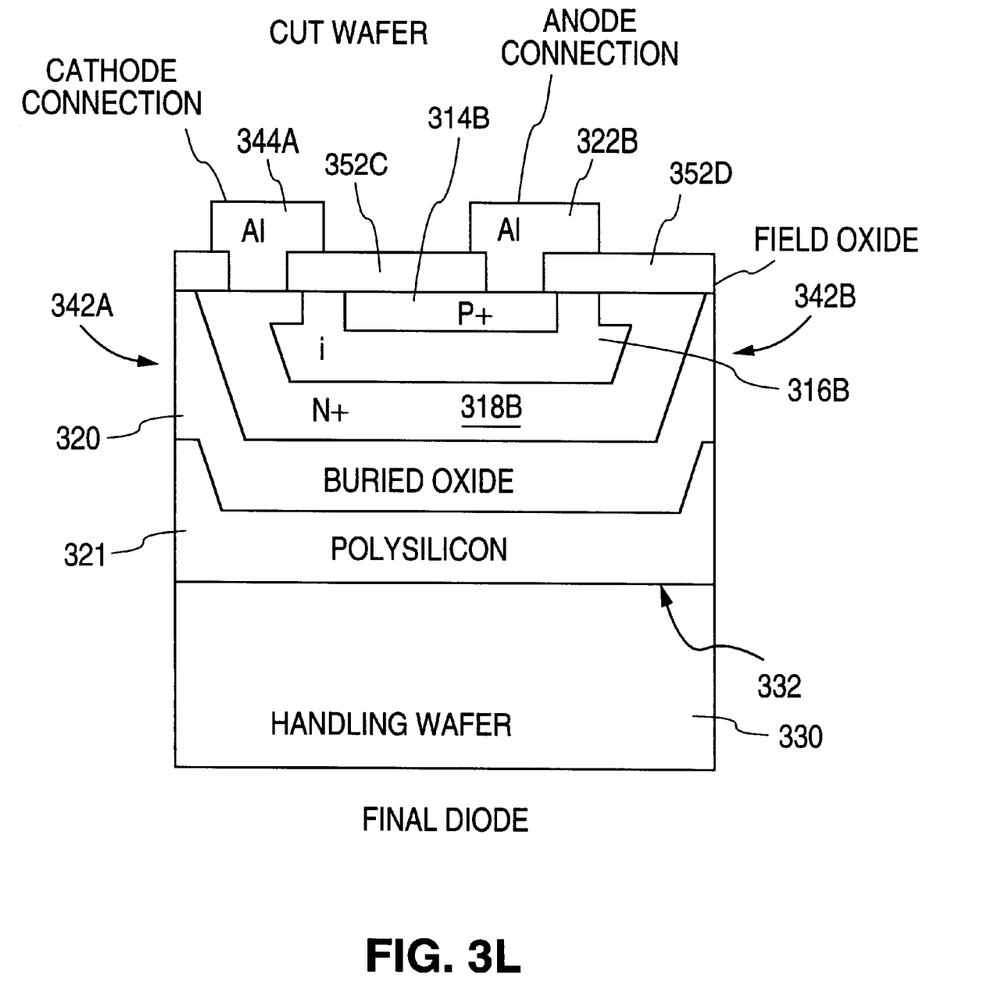

Finaly, fabrication wafer 312 and handling wafer 330 are diced to obtain the individual photodiode die. A resulting individual photodiode die is shown in FIG. 3L.

The processing method described above has several advantages over conventional processing techniques. One advantage is that the rigidity of the handling wafer 330 allows the fabrication wafer 312 to be lapped as thin as desired such that the intrinsic region 318 of the resulting PIN photodiode obtains optimum performance without the danger of breakage during further processing due to the thin nature of the fabrication wafer. Another advantage is that V-grooves 342A and 342B allow planar topside connections for the anode 322B and cathode 344A of the PIN photodiode which avoids the necessity of conductive die bonding for the backside diode connection experienced with conventional PIN photodiodes. Furthermore, the V-grooves isolate the depleted active region, formed in intrinsic region 316B when the photodiode is reverse biased, from the non-depleted regions at the periphery of the photodiode which blocks the flow toward P+ region 314B and N+ region 318B of slow diffusing photogenerated charge carrier pairs arising in drift regions. This improves the photodiode speed of response.

Also, controlling the thickness of the buried field oxide layer 320 allows the creation of a dielectric reflector for improved light absorption efficiency. Finally, it is advantageous that the handling wafer at the backside of the photodiode is dielectrically isolated from the diode and therefore can be biased as required or grounded as a shield to minimize signal interference problems.

FIGS. 4A–H illustrate yet another embodiment of a process for producing a PIN photodiode according to the present invention. The process illustrated in FIGS. 4A–H requires fewer mask steps than other the other processes described herein. Reducing the number of masks reduces the costs for fabricating a PIN photodiode.

Figure 4A:
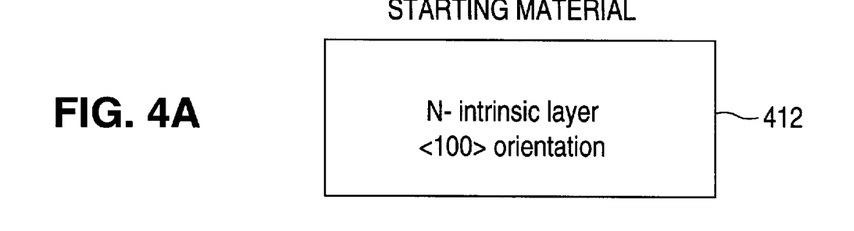
FIGS. 4A–H illustrate a series of steps for yet another embodiment of a process for producing a PIN photodiode according to the present invention.
Figure 4B:
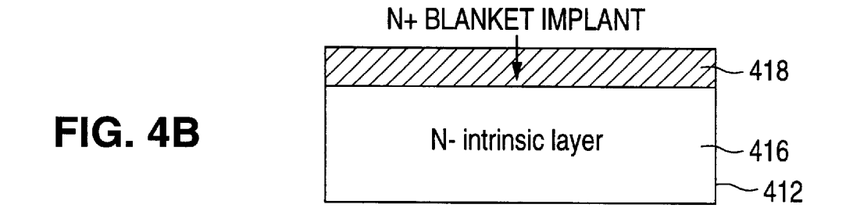

In the process shown in FIGS. 4A–H, fabrication wafer 412 is composed of lightly doped intrinsic silicon with a <100> crystal orientation, as illustrated in FIG. 4A, which will form an intrinsic layer for a PIN photodiode. Fabrication wafer 412 receives a blanket N+ implant 418 on top of intrinsic region 416, as shown in FIG. 4B. During the subsequent processing steps, N+ thin layer 418 will experience further diffusion into intrinsic layer 412 due to high processing temperatures and this diffusion must be taken into account when implementing the process.

Figure 4C:
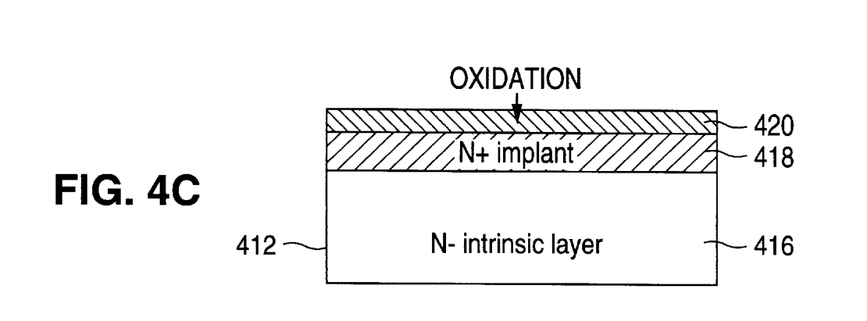

A field oxide layer 420 is then formed upon a surface of fabrication wafer 412 that covers N+ blanket region 418, as shown in FIG. 4C. The thickness of field oxide layer 420 can be optionally controlled so as to form a dielectric interference reflector for improved light absorption efficiency of the resulting photodiode. The bonding oxide layer 420 is then polished and fabrication wafer 412 is bonded to a polished handle wafer 430 to obtain the structure shown in FIG. 4D.

Figure 4D:
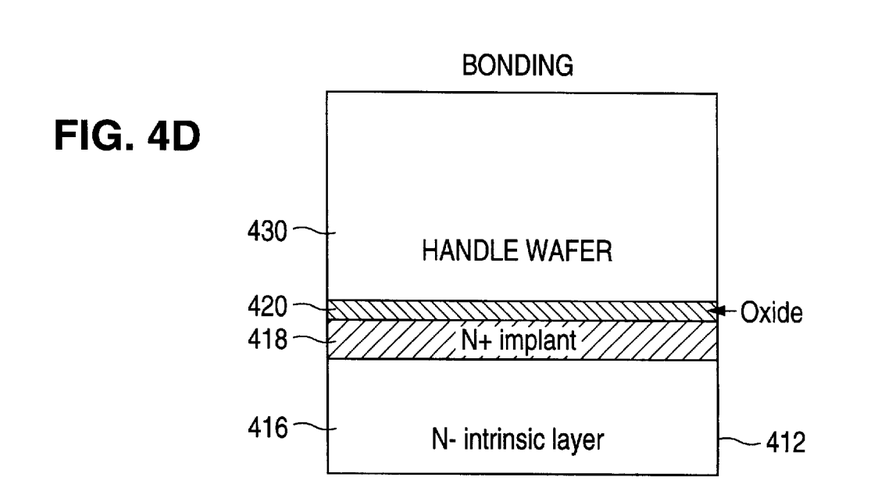

As illustrated in the processes above, the handle wafer 430 provides mechanical rigidity needed during processing, especially since the intrinsic region 416 of the fabrication wafer 412 will be lapped to a thin thickness in order to optimize the performance of the resulting PIN photodiode. Thus, after the handle wafer 430 is bonded to the bonding oxide layer 420, the resulting structure is flipped to permit intrinsic region 416 to be lapped.

Figure 4E:
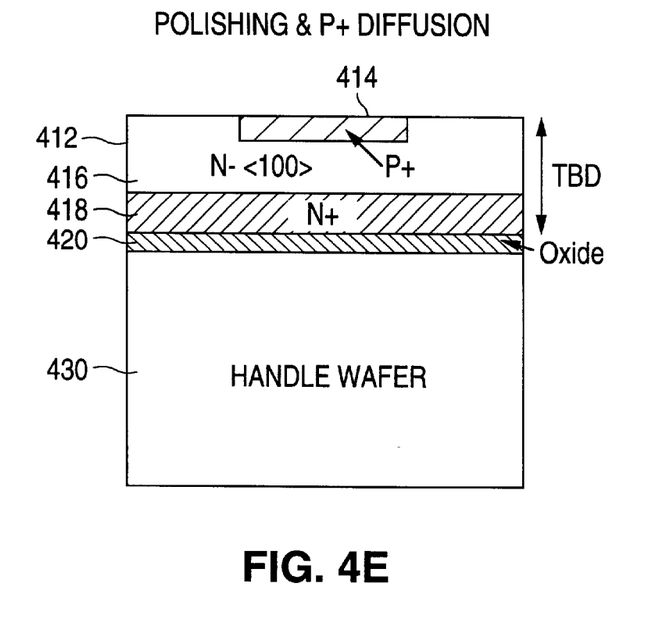

The intrinsic layer 416 is lapped to a thickness determined by the electrical performance characteristics desired for the finished PIN photodiode. The surface of fabrication wafer 412 is then masked and P+ dopants are diffused into selective areas to form P+ region 414 that will constitute the anode of the finished PIN photodiode. The resulting structure is shown in FIG. 4E. Note that the diffusion of P+ dopants to produce P+ region 414 is the first step in the process that requires a mask.

Figure 4F:
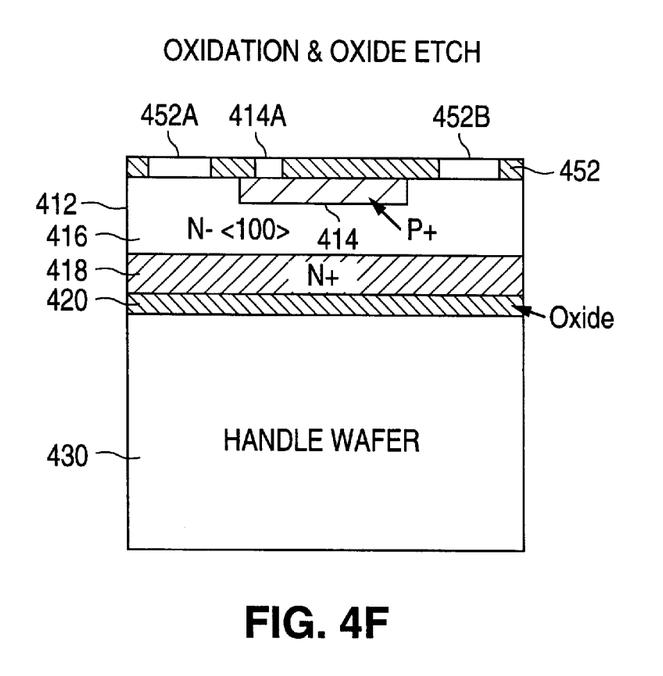
Figure 4G:
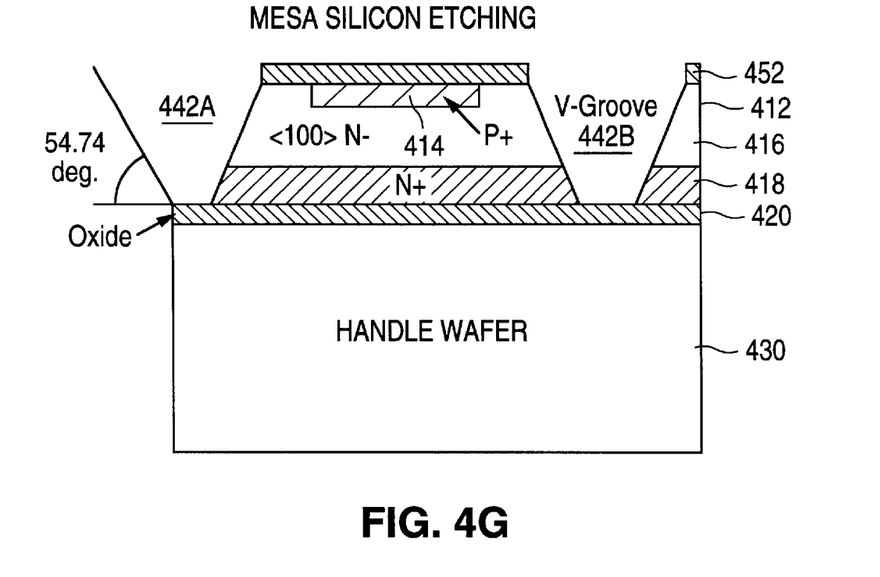

A field oxide 452 is then formed on the exposed surface of fabrication wafer 412. The surface of fabrication wafer 412 is then masked in order to etch field oxide 452 to form contact opening 414A adjacent to P+ region 414 and oxide openings 452A and 452B, as shown in FIG. 4F.

The exposed surface of fabrication wafer 412 is then masked again in order to protect contact opening 414A to P+ region 414. Oxide openings 452A and 452B of FIG. 4F remain exposed and are subsequently etched to form V-grooves 442A and 442B shown in FIG. 4G. Because the <100> N–silicon of fabrication wafer 412 is anisotropically etched, the V-grooves 442A and 442B are formed with a flat bottom that extends down to oxide layer 420. The angle of the V-grooves is determined by the dense atomic planes of silicon and typically results in an 54.74 degree angle to the walls of the V-grooves.

Figure 4H:
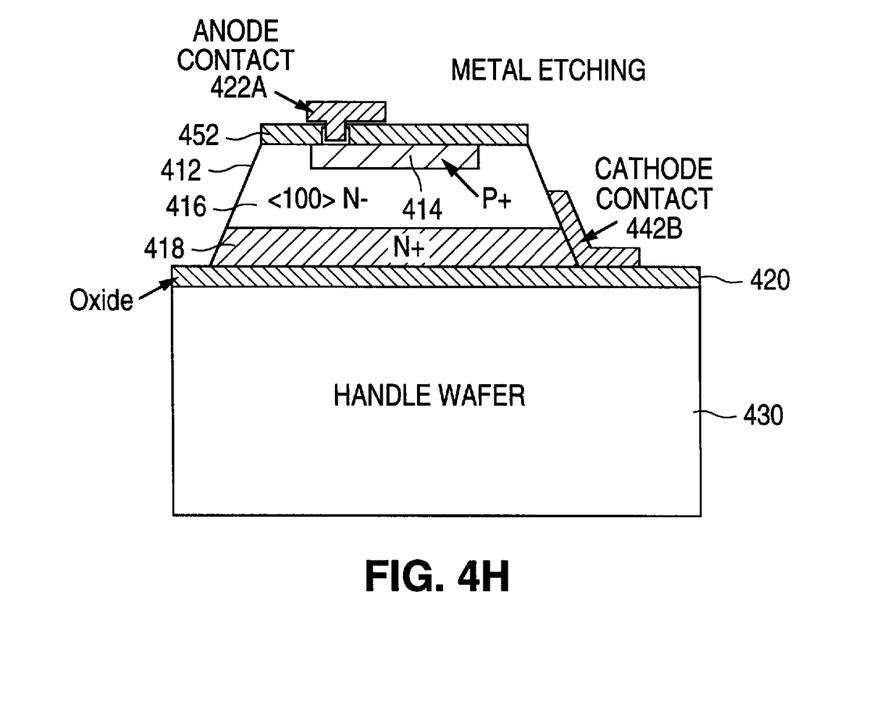

The exposed surface of fabrication wafer 412 is again masked and etched to form contact openings. A layer of metal is sputtered onto the surface of fabrication wafer 412 to form anode contact 422A that connects to P+ region 414 and cathode contact 442B connected to N+ layer 418. The completed PIN photodiode, dubbed a MESA photodiode by the inventor, is shown in FIG. 4H.

Figure 5:
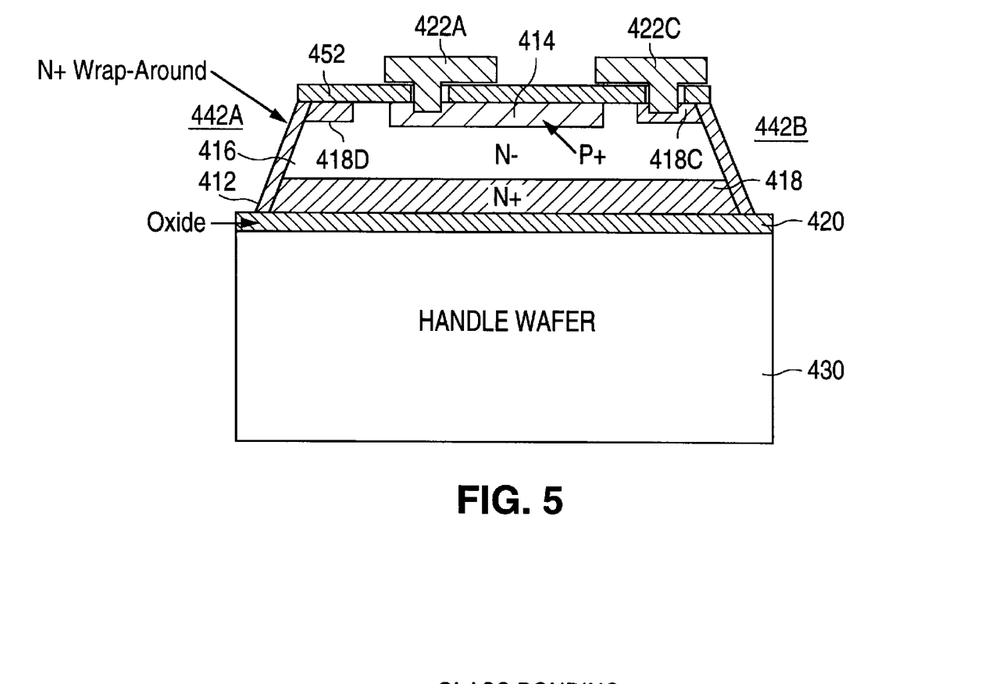
FIG. 5 represents an alternative embodiment of a PIN photodiode achievable using the process of FIGS. 4A–H.

Alternatively, both the anode and cathode connections can be formed on a coplanar surface of the fabrication wafer 412. The resulting coplanar PIN photodiode is shown in FIG. 5. In order to obtain the coplanar PIN photodiode, the sides of V-grooves 442A and 442B shown in FIG. 4I are N+ doped to produce a N+ wrap-around that surrounds intrinsic region 416. In addition, the N+ doping is applied to produce surface regions 418C and 418D shown in FIG. 5. Regions 418C and 418D can be produced by a number of ways including masking and etching the oxide layer 452 and by diffusing N+ dopants into the intrinsic region 416 from the walls of V-grooves 452A and 452B.

The result is an N+ blanket region 418 forming a N+ wrap-around along the sides of V-grooves 442A and 442B and reaching to the top surface of fabrication wafer 412. Oxide layer 452 is then masked and etched to form openings in the oxide layer adjacent to the P+ region 414 and N+ region 418C. A metal layer is deposited and selectively etched to form contact 422A connected to P+ region 414 and contact 422C connected to N+ region 418C, as shown in FIG. 5.

Figure 6:
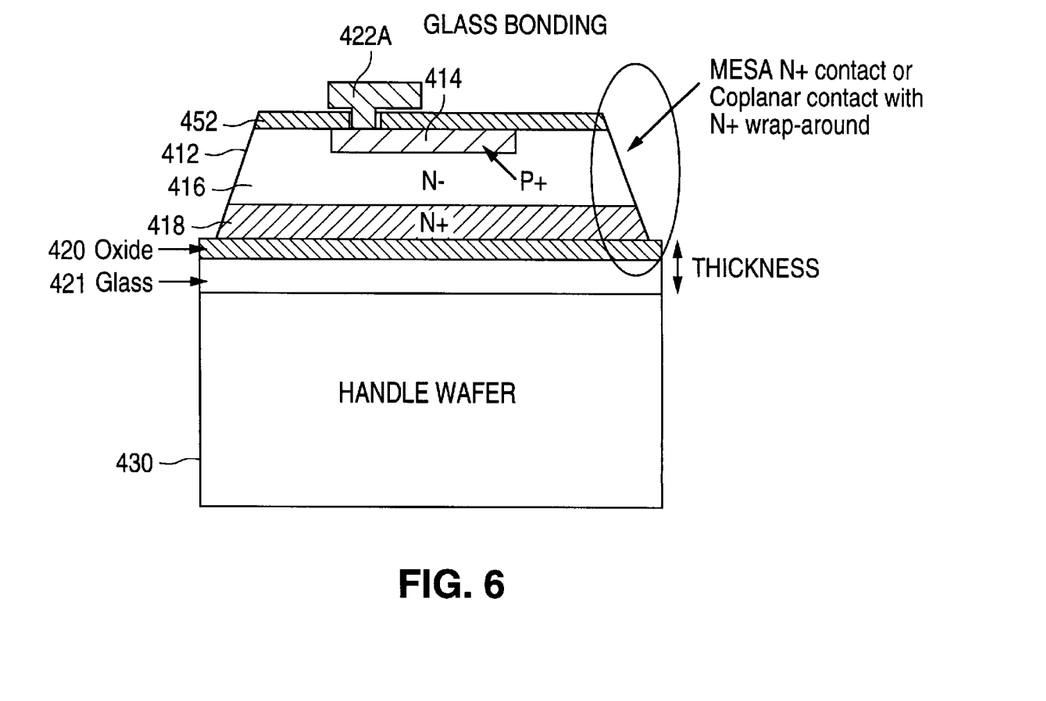
FIG. 6 represents another alternative embodiment of a PIN photodiode achievable using the process of FIGS. 4A–H.

Yet another alternative in the process of FIGS. 4A–H is the addition of a glass bonding layer. A layer of glass can be formed on a polished surface of handle wafer 430. The glass layer is then bonded to the fabrication wafer 412 structure shown in FIG. 4C. This layer of glass is shown as layer 421 in the resulting PIN photodiode shown in FIG. 6. As noted above, it is necessary that field oxide layer 420 be kept thin, on the order of 2 micrometers. Layer of glass 421, however, can be made comparatively thick. The resulting dielectric layer formed by the combination of field oxide layer 420 and layer of glass 421, is much thicker than field oxide layer 420 alone. This, in turn, reduces the parasitic capacitance formed between fabrication wafer 412 and handle wafer 430.

It should be noted that, while the processes above are illustrated in the context of a single PIN photodiode, the processes are preferably applied to rows of multiple photodiodes formed on fabrication wafer 412. The fabrication wafer 412 bonded to handle wafer 430 is diced in order to obtain the individual photodiode die.

The process described in the context of FIGS. 4A–H above has several advantages over conventional processing techniques. Similar to the other processes described above, the technique of bonding a handle wafer to the fabrication wafer permits the intrinsic layer 416 of fabrication wafer 412 to be lapped to the thinness needed to obtain a desired PIN photodiode efficiency and performance while decreasing the risk of fabrication wafer breakage during processing. The V-grooves 442A and 442B also provide a high level of isolation. In addition, the process of FIGS. 4A–H represents a process that is simpler than the other processes according to the present invention and requires as few as four masks in order to produce a high performance PIN photodiode. Because there are fewer steps and masks involved in the semiconductor processing for producing the PIN photodiode, the cost of the photodiode can be reduced.

Having illustrated and described the principles of the present invention in the context of the embodiments described above, it should be readily apparent to those of ordinary skill in the art that the invention can be modified in arrangement and detail without departing from such principles. It will be readily understood by one of ordinary skill in the art that while the present invention is discussed in the context of producing a PIN photodiode, the present invention is applicable to other semiconductor devices and processes without departing from the scope and spirit of the present invention. I claim all modifications and variations coming within the spirit and scope of the present invention.

I claim:

1. A method for fabricating a PIN photodiode, the method comprising the steps of:

providing a first semiconductor substrate lightly doped with a first dopant type, the first semiconductor substrate having first and second planar surfaces;

diffusing the first planar surface of the first semiconductor substrate with the first dopant type to form a first active region;

forming a first oxide layer on the first planar surface of the first semiconductor substrate;

bonding a first surface of a second semiconductor substrate to the first planar surface of the first semiconductor substrate;

lapping the second planar surface of the first semiconductor substrate;

selectively masking and diffusing a predetermined portion of the second planar surface of the first semiconductor substrate with a second dopant type to form a second active region;

forming a second oxide layer on the second planar surface of the first semiconductor substrate;

selectively masking and etching the second oxide layer to form a first contact hole in the second oxide layer and an etching opening in the second oxide layer;

selectively etching the etching opening in the second oxide layer down to the first oxide layer to form an isolation trench; and forming a first contact in the first contact hole.

2. The method of claim 1, further including the step of forming a second contact on a wall of the isolation trench in electrical contact with the first active region.

3. The method of claim 1, wherein:

the step of providing a first semiconductor substrate includes providing a first semiconductor substrate having a selected crystal orientation; and the step of selectively etching the etching opening in the second oxide layer further comprises anisotropically etching the etching opening to form a V-groove.

4. The method of claim 3, further including the step of diffusing a wall of the V-groove with the first dopant type.

5. The method of claim 4, where the step of selectively masking and etching the second oxide layer further comprises selectively masking and etching the second oxide layer to form a second contact hole in the second oxide layer adjacent to a diffused portion of the wall of the V-groove and including the step of forming a second contact in the second contact hole.

6. The method of claim 1, further including the step of forming a glass layer on the first surface of the second semiconductor substrate.

7. The method of claim 1, wherein the step of forming a first oxide layer on the first surface of the first semiconductor wafer includes controlling a thickness of the first oxide layer to form a dielectric interference reflector.

8. A method for producing a dielectrically isolated PIN diode, the method comprising the steps:

lightly doping a first semiconductor substrate with a first dopant type, the first semiconductor substrate having first and second planar surfaces;

forming a first active region on the first surface of the first semiconductor substrate, where the first active region is doped with the first dopant type;

forming a first oxide layer on the first surface of the first semiconductor substrate;

bonding a first surface of a second semiconductor substrate to the first planar surface of the first semiconductor substrate;

lapping the second planar surface of the first semiconductor substrate to form an intrinsic region of a predetermined thickness;

forming a second active region in a selected portion of the second planar surface of the first semiconductor substrate with a second dopant type;

forming a second oxide layer on the second planar surface of the first semiconductor substrate;

forming a first contact opening in the second oxide layer, where the first contact hole is adjacent to the second active region;

forming an oxide opening in the second oxide layer, where the oxide opening is adjacent a portion of the intrinsic region and separate from the second active region; and etching the portion of the intrinsic region exposed by the oxide opening down to the first oxide layer to form an isolation trench.

9. The method of claim 8, further including the step of forming a second contact on a wall of the isolation trench in electrical contact with the first active region.

10. The method of claim 8, wherein the first semiconductor substrate has a selected crystal orientation and the step of etching the portion of the intrinsic region exposed by the oxide opening down to the first oxide layer further comprises anisotropically etching the oxide opening to form a V-groove.

11. The method of claim 10, further including the step of diffusing a wall of the V-groove with the first dopant type.

12. The method of claim 11, where the step of forming a first contact opening in the second oxide layer further includes forming a second contact opening in the second oxide layer adjacent to a diffused portion of the wall of the V-groove and including the step of forming a second contact in the second contact hole.

13. The method of claim 8, further including the step of forming a glass layer on the first surface of the second semiconductor substrate.

14. The method of claim 1, wherein the step of forming a first oxide layer on the first surface of the first semiconductor wafer includes controlling a thickness of the first oxide layer to form a dielectric interference reflector.

* * * * *